(12) United States Patent
Yoshikawa et al.

(10) Patent No.: US 9,727,101 B2
(45) Date of Patent: Aug. 8, 2017

(54) COOLING APPARATUS AND COOLING SYSTEM FOR ELECTRONIC-DEVICE EXHAUSTION

(75) Inventors: Minoru Yoshikawa, Tokyo (JP); Kenichi Inaba, Tokyo (JP)

(73) Assignee: NEC Corporation, Tokyo (JP)

( * ) Notice: Subject to any disclaimer, the term of this patent is extended or adjusted under 35 U.S.C. 154(b) by 587 days.

(21) Appl. No.: 13/638,343

(22) PCT Filed: Mar. 1, 2011

(86) PCT No.: PCT/JP2011/054661
§ 371 (c)(1),
(2), (4) Date: Sep. 28, 2012

(87) PCT Pub. No.: WO2011/122207
PCT Pub. Date: Oct. 6, 2011

(65) Prior Publication Data
US 2013/0019627 A1    Jan. 24, 2013

(30) Foreign Application Priority Data

Mar. 30, 2010 (JP) .................................. 2010-079619

(51) Int. Cl.
*G06F 1/20* (2006.01)
*H05K 7/20* (2006.01)
*F28D 15/02* (2006.01)

(52) U.S. Cl.
CPC ........... *G06F 1/20* (2013.01); *H05K 7/20818* (2013.01); *F28D 15/0266* (2013.01)

(58) Field of Classification Search
CPC ............... H05K 7/208; H05K 7/20809; H05K 7/20818; H05K 7/20827; F28D 15/043; F28D 15/0266; G06F 1/20
(Continued)

(56) References Cited

U.S. PATENT DOCUMENTS 5,940,270 A * 8/1999 Puckett ..................... 361/699
6,819,563 B1 * 11/2004 Chu et al. ................. 361/696
(Continued)

FOREIGN PATENT DOCUMENTS

JP    2009-059000 A    3/2009
JP    2009-105141 A    5/2009
(Continued)

OTHER PUBLICATIONS

Office action mailed Mar. 3, 2015 in related Japanese application No. 2012-508159 with partial English-language translation (5 pgs.).

*Primary Examiner* — Jianying Atkisson
*Assistant Examiner* — Antonio R Febles
(74) *Attorney, Agent, or Firm* — Foley & Lardner LLP

(57) ABSTRACT

The cooling apparatus (10) for electronic-device exhaustion includes an evaporator unit (201), a fluid piping (306) and a vapor piping (305). A plurality of evaporator units (201) is disposed in a rack (100) in the height direction, and have a dimension in height of any of 2U, 3U, and 4U with 1U being 44.45 mm. The evaporator unit causes a coolant fluid thereinside to vaporize and produce a coolant vapor by heat of the exhaust air from an electronic device loaded in the rack (100), and cools the exhaust air. The fluid piping (306) is a supply route of the coolant fluid to the evaporator units (201), the vapor piping (305) is a discharging route of the coolant vapor from the evaporator units (201), and both are commonly connected to the plurality of evaporator units (201).

6 Claims, 13 Drawing Sheets

(58) Field of Classification Search
USPC ....... 62/259.2, 404, 410, 411, 519, 524, 525
See application file for complete search history.

(56) References Cited

U.S. PATENT DOCUMENTS

| | | | |
|---|---|---|---|
| 7,397,661 B2* | 7/2008 | Campbell et al. ............ 361/696 |
| 7,832,925 B2* | 11/2010 | Archibald et al. ............. 374/29 |
| 7,908,883 B2* | 3/2011 | Wu et al. ........................ 62/441 |
| 2001/0042616 A1* | 11/2001 | Baer ............................ 165/299 |
| 2003/0010477 A1 | 1/2003 | Khrustalev et al. |
| 2004/0100770 A1* | 5/2004 | Chu et al. ..................... 361/698 |
| 2005/0081534 A1* | 4/2005 | Suzuki et al. ................. 62/50.2 |
| 2009/0046430 A1* | 2/2009 | Brewer et al. ................ 361/701 |
| 2009/0100848 A1* | 4/2009 | Kuriyama et al. ............. 62/132 |
| 2009/0154096 A1* | 6/2009 | Iyengar et al. ............... 361/694 |
| 2009/0225513 A1* | 9/2009 | Correa et al. ................ 361/700 |
| 2009/0260384 A1* | 10/2009 | Champion et al. .......... 62/259.2 |
| 2010/0319379 A1* | 12/2010 | Zangari et al. ................. 62/255 |
| 2012/0297807 A1* | 11/2012 | Canney ................ H05K 7/1497 |
| | | 62/228.4 |

FOREIGN PATENT DOCUMENTS

| | | |
|---|---|---|
| JP | 2009-134507 A | 6/2009 |
| JP | 2009-135287 A | 6/2009 |
| JP | 2009-157681 A | 7/2009 |
| JP | 2009-193137 A | 8/2009 |
| JP | 2009-193244 A | 8/2009 |
| JP | 2009-299478 A | 12/2009 |

* cited by examiner

COOLING APPARATUS AND COOLING SYSTEM FOR ELECTRONIC-DEVICE EXHAUSTION

This application is the National Phase of PCT/JP2011/054661, filed Mar. 1, 2011, which claims priority to Japanese Application No. 2010-079619, filed Mar. 30, 2012, the disclosures of which are hereby incorporated by reference in their entirety.

TECHNICAL FIELD

The present invention relates to a cooling apparatus for electronic-device exhaustion which cools exhaust air from an electronic device loaded in a rack and a cooling system employing the cooling apparatus.

BACKGROUND ART

Electronic devices, such as a computer and a network device, are interconnected with a plurality of devices in order to increase the data processing capability and a data processing capacity. Since the floor space is limited, a plurality of electronic devices is collectively loaded in a rack. The processing speed and the processing capability of those electronic devices have been improving rapidly, and the amount of heat generated in such an electronic device is increasing steadily. Conversely, those electronic devices have a temperature environment set to be relatively low for a normal operation. Hence, heats generated in the electronic devices loaded in the rack are cooled by cooling the electronic devices and evacuated to the exterior of the electronic devices as exhaust air after the cooling. However, when heats by such exhaust air remain in the rack and the temperature inside the rack increases, the electronic devices may become unable to operate appropriately.

Accordingly, exhaust air from the electronic devices is evacuated to the exterior of the rack in order to suppress a temperature rise inside the rack. However, air utilized for cooling the electronic devices is air (room air) in the room where the rack is placed. Hence, when the temperature inside the room rises due to the exhaust air from the rack, the cooling performance for the electronic devices by the room air decreases. Moreover, when a plurality of racks is placed in the room, exhausted heats from respective racks may interfere with each other, and an area so-called a hot spot is produced where a temperature is locally high. When the rack is located in such a place, the cooling performance for the electronic devices by the room air further decreases.

In order to address this technical issue, Patent Literatures 1 to 5 disclose technologies relating to a cooling apparatus for cooling exhaust air from electronic devices by utilizing the vaporization-condensation cycle of a coolant. According to this cooling apparatus, exhaust air from an electronic device is directed to a heat exchanger, and is cooled by the latent heat by the vaporization of the coolant circulating in the heat exchanger.

Such a cooling apparatus operates as follows.

Air heated in the electronic device is evacuated as hot exhaust air from the rear face of the electronic device by a fan built therein, and passes through an evaporator (hereinafter, referred to as an evaporator unit) serving as the heat exchanger placed on a rear door of the rack or an inner door, etc., inwardly of the rear door. At this time, a fluid coolant (coolant fluid) charged in the evaporator unit and having a low boiling point removes heat from the exhaust gas from the electronic device, the exhaust gas passing through the evaporator unit, vaporizes, and changes the phase from a fluid (the coolant fluid) to a vapor (a coolant vapor). The exhaust air from the electronic device is mainly cooled by the latent heat derived from such phase change, and is evacuated to the exterior of the rack. When the coolant changes the phase thereof from the fluid to the vapor, the volume thereof increases, and thus the pressure of the coolant vapor increases. The coolant vapor having the pressure increased moves, due to pressure gradient, to a condenser unit where a pressure is low. The coolant vapor is cooled by the condenser unit to dissipate heats, changes the phase thereof to the coolant fluid, and flows back to the evaporator unit again. The exhaust air, in a cooled condition, from the electronic device is returned in this manner from the rack to the interior of the room. Accordingly, a temperature rise of the interior of the room where the rack is placed can be prevented, and the cooling performance for the electronic devices by the room air can be maintained well.

PRIOR ART LITERATURE

Patent Literature

Patent Literature 1: Unexamined Japanese Patent Application Kokai Publication No. 2009-193244

Patent Literature 2: Unexamined Japanese Patent Application Kokai Publication No. 2009-105141

Patent Literature 3: Unexamined Japanese Patent Application Kokai Publication No. 2009-134507 Patent Literature 4: Unexamined Japanese Patent Application Kokai Publication No. 2009-135287

Patent Literature 5: Unexamined Japanese Patent Application Kokai Publication No. 2009-193137

DISCLOSURE OF THE INVENTION

Problems to be Solved by the Invention

According to the technology disclosed in Patent Literature 1, the evaporator (hereinafter, referred to as an evaporator unit) is provided for each server (in the following explanation, referred to as an electronic device including the server). Hence, cooling of the evacuated air is enabled for each electronic device. However, the evaporator unit must be equipped in accordance with the electronic device, and thus the installation of the evaporator unit is complicated. For example, when some of the electronic devices in the rack are replaced, it is necessary to replace some of the evaporators in accordance with the replacement of the electronic devices. Moreover, exhaust air is cooled by one evaporator running in the height direction of the rack for each electronic device, and when the length of the electronic device in the height direction of the rack (hereinafter, referred to as a "dimension in height of an electronic device") is large, the length of the evaporator unit in the height direction of the rack (hereinafter, referred to as a "dimension in height of an evaporator unit") becomes also large, bringing about a technical issue to be discussed later.

In contrast, according to the technologies disclosed in Patent Literatures 2 to 5, the evaporator (hereinafter, referred to as an evaporator unit) is attached to the rear door of a cabinet (hereinafter, referred to as a rack), and a plurality of evaporator units is disposed along the height direction of the rack.

Since the plurality of evaporator units is independently installed from the layout of the individual electronic devices loaded in the rack, the electronic device in the rack can be replaced and used while leaving the evaporator unit as it is without any change.

However, like Patent Literature 1, when the dimension in height of one evaporator unit running in the height direction of the rack is large, the following technical issue occurs.

Vapor having undergone a phase change in the evaporator unit is accumulated in the upper part of the evaporator unit as time advances. No cooling utilizing the latent heat is performed by the coolant vapor, and thus the cooling performance decreases at a part of the evaporator unit where the coolant vapor is accumulated. That is, the coolant (the coolant vapor) vaporized by the heat of exhaust air evacuated from the electronic device to a position corresponding to the lower part of the evaporator unit is accumulated in the upper part of the evaporator unit, making the cooling performance decreased for exhaust air evacuated from the electronic device to a position corresponding to the upper part of the evaporator unit. As a result, the exhaust air evacuated from the electronic device to the position corresponding to the upper part of the evaporator unit is not cooled sufficiently in some cases. The amount of coolant vapors produced varies depending on the amount of heat generation along with the operated condition of the electronic device, and this technical issue becomes remarkable when the amount of heat generation by the electronic device increases.

According to Patent Literature 1, since the evaporator unit is provided for each electronic device, the amount of coolant vapors accumulated in the upper part of the evaporator unit varies depending on the dimension in height of each electronic device, and the length of the portion of the upper part of the evaporator unit where the cooling performance decreases is also different. Hence, when the dimension in height of the electronic device is large, the length of the portion of the upper part of the evaporator unit where the cooling performance decreases becomes long, and thus exhaust air from the electronic device cannot be cooled sufficiently in some cases.

According to the technologies disclosed in Patent Literature 2 to 5, the evaporator unit is installed in the rack and the plurality of evaporator units is disposed along the height direction of the rack. Accordingly, the amount of coolant vapors accumulated in one evaporator unit is small in comparison with the evaporator unit for a case in which one evaporator covers the entire rack in the height direction and the evaporator unit for a case in which the dimension in height of the electronic device is large like Patent Literature 1. However, depending on the dimension in height of the evaporator unit and the dimension in height of the electronic device loaded in the rack, the coolant vapor accumulated in the upper part may cause the partially insufficient cooling of exhaust air from the electronic device.

Hence, conventional cooling apparatuses for electronic-device exhaustion do not have a sufficient performance yet from the standpoint of efficient cooling of exhaust air from the electronic device loaded in the rack regardless of the layout of the electronic device loaded therein.

The present invention has been made in view of the above-explained circumstances, and it is an object of the present invention to provide a cooling apparatus for electronic-device exhaustion which can efficiently cool exhaust air from an electronic device loaded in a rack regardless of the layout of the electronic device loaded therein, and a cooling system for electronic-device exhaustion which uses this cooling apparatus.

Means for Solving the Problems

To achieve the above object, a first aspect of the present invention provides a cooling apparatus for electronic-device exhaustion which cools exhaust air from an electronic device loaded in a rack, the cooling apparatus for electronic-device exhaustion includes: a plurality of evaporator units which is disposed in the rack along a height direction of the rack, causes a coolant fluid filled in each evaporator unit to vaporize and produce a coolant vapor by heat of the exhaust air flowing in and passing through each evaporator unit to cool the exhaust air; a first passage that is a supply route of the coolant fluid to each of the evaporator units; and a second passage that is a discharging route of the coolant vapor from each evaporator unit, in which a length of the evaporator unit in the height direction of the rack is any of 2 U, 3 U, and 4 U in accordance with a position where the evaporator unit is disposed in the height direction of the rack with 1 U being 44.45 mm, and the first passage and the second passage are commonly connected to the plurality of evaporator units.

To achieve the above object, a second aspect of the present invention provides a cooling system for electronic-device exhaustion, the cooling system comprising: the cooling apparatus for electronic-device exhaustion of the first aspect; a condenser unit disposed upwardly of the cooling apparatus for electronic-device exhaustion; and a coolant which circulates between the condenser unit and the cooling apparatus for electronic-device exhaustion, in which the condenser unit is connected to the first passage and the second passage in the cooling apparatus for electronic-device exhaustion.

Effect of the Invention

According to the present invention, it becomes possible to provide a cooling apparatus for electronic-device exhaustion which can efficiently cool exhaust air from an electronic device loaded in a rack regardless of the layout of the electronic device loaded therein, and a cooling system for electronic-device exhaustion which uses this cooling apparatus.

MODE FOR CARRYING OUT THE INVENTION

An explanation will be given of a cooling apparatus 10 according to an embodiment of the present invention with reference to the accompanying drawings.

<First Embodiment>

Figure 1:
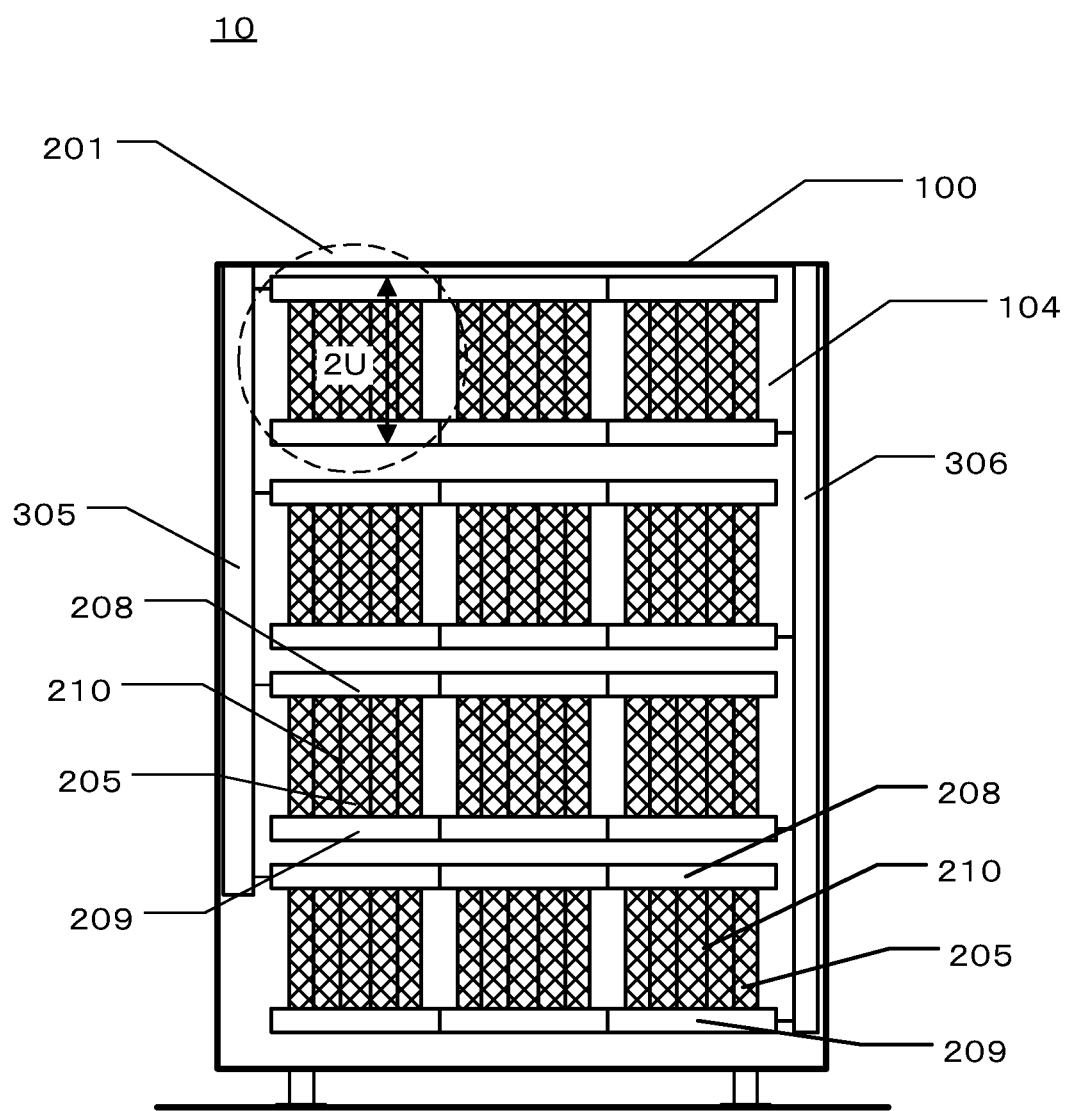
FIG. 1 is a rear cross-sectional view showing an illustrative rack equipped with a cooling apparatus according to a first embodiment of the present invention.

A cooling apparatus 10 according to a first embodiment includes, as shown in FIG. 1, a rack 100, a plurality of evaporator units 201, a fluid piping 306 where a coolant fluid flows, and a vapor piping 305 where a coolant vapor flows. A plurality of electronic devices is loaded in the rack 100 along the height direction. In the following explanation, it is defined that a width direction of the rack 100 is a direction orthogonal to both of the direction in which an electronic device 102 is inserted to load the electronic device 102 in the rack 100, and the height direction of the rack 100.

Figure 2:
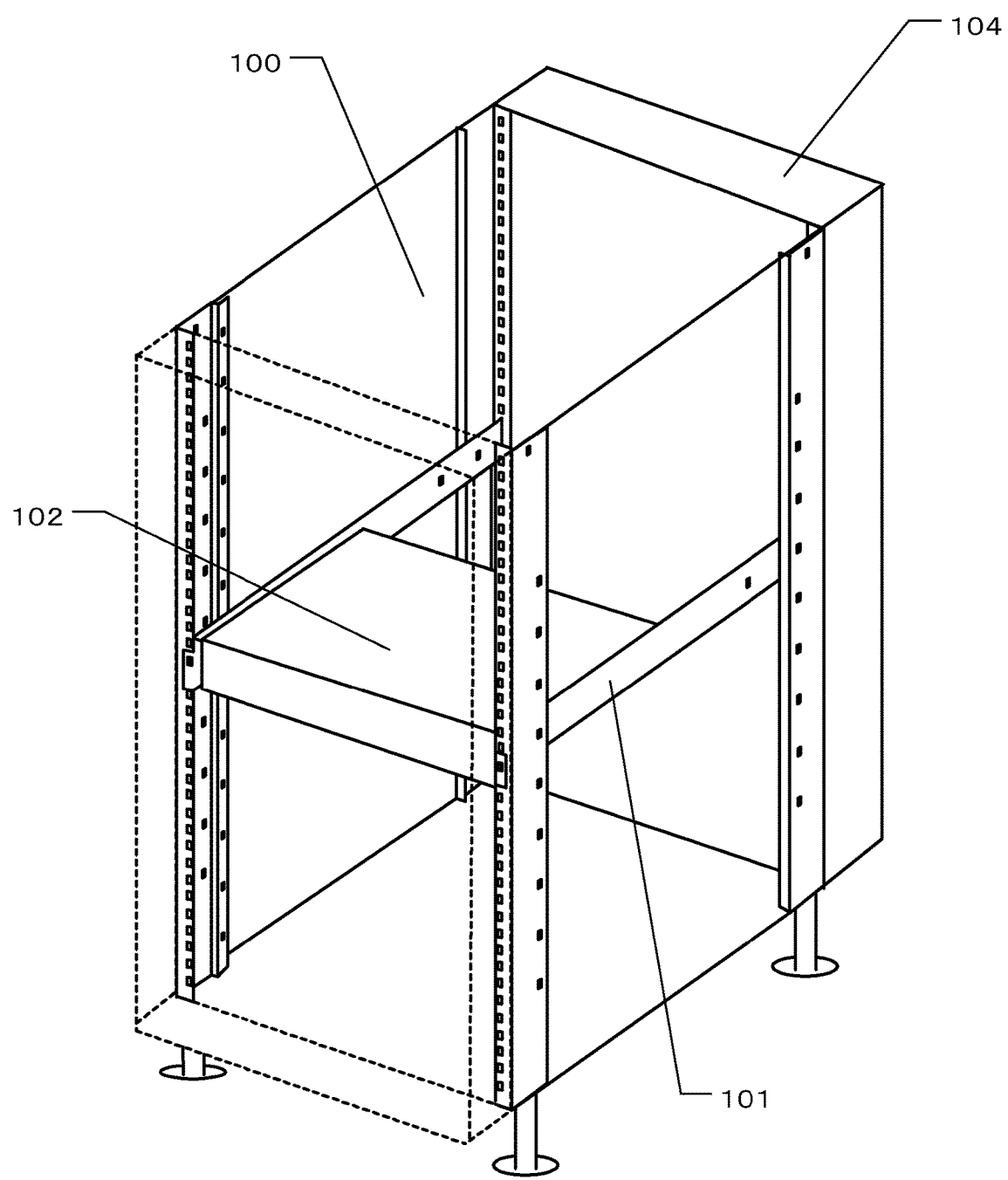
FIG. 2 is a perspective view showing an illustrative interior of the rack.

The rack 100 is a 19-inch rack defined by an EIA (The Electrical Industries Association) standard. As shown in FIG. 2, the rack 100 has, at the back thereof, an openable/closable rear door 104. The rack 100 has holes provided in pillars of the rack 100 per 1 U unit so that the position where the electronic device 102 is placed can be changed per 1 U unit in accordance with the dimension in height of the electronic device 102 loaded in the rack. Note that U (unit) is a unit indicating a dimension in height defined by the EIA standard, and 1 U=44.45 millimeter (mm).

Figure 3:
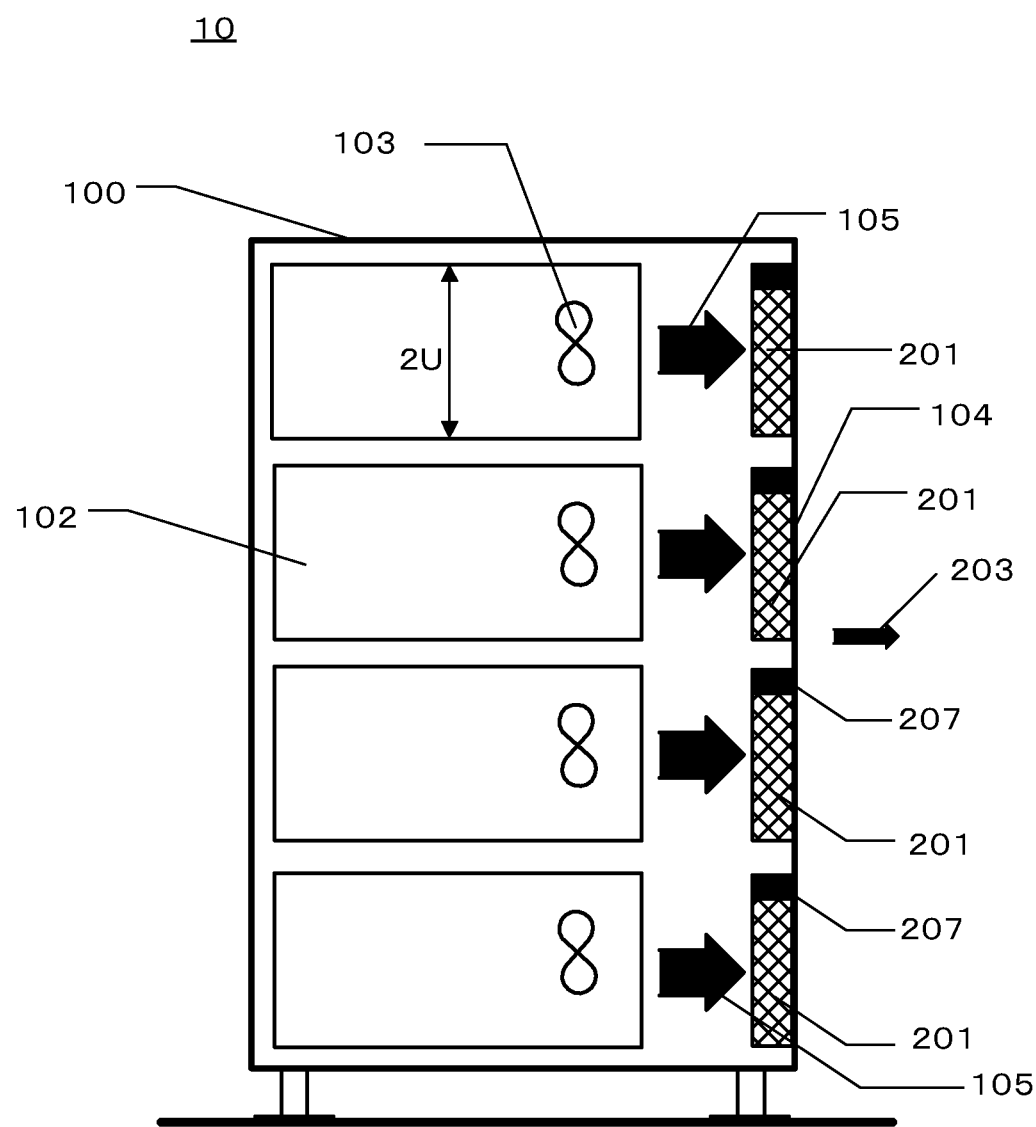
FIG. 3 is a side cross-sectional view showing an illustrative cooling apparatus according to the first embodiment.

The electronic device 102 is loaded in the rack 100 while being fastened to each rail 101 by screws, etc., and the rail 101 is fastened to the holes provided in the pillars of the rack 100 by screws, etc. In order to facilitate understanding to the explanation, in FIGS. 3 to 13, the pillars and the rails 101 are omitted. As shown in FIG. 3, a fan 103 is built in each electronic device 102. The fan 103 introduces air from the interior of a room where the rack 100 is installed to the interior of the electronic device 102, removes heat inside the electronic device 102 by this air, evacuates this air as exhaust air 105 to the exterior of the electronic device 102 from an exhaust outlet provided in the rear of the electronic device 102, and evacuates the exhaust air to the exterior of the rack 100. The evaporator units 201 are disposed in such a way that the exhaust air 105 from the electronic device 102 passes through the evaporator unit 201 before evacuated to the exterior of the rack 100.

Figure 4:
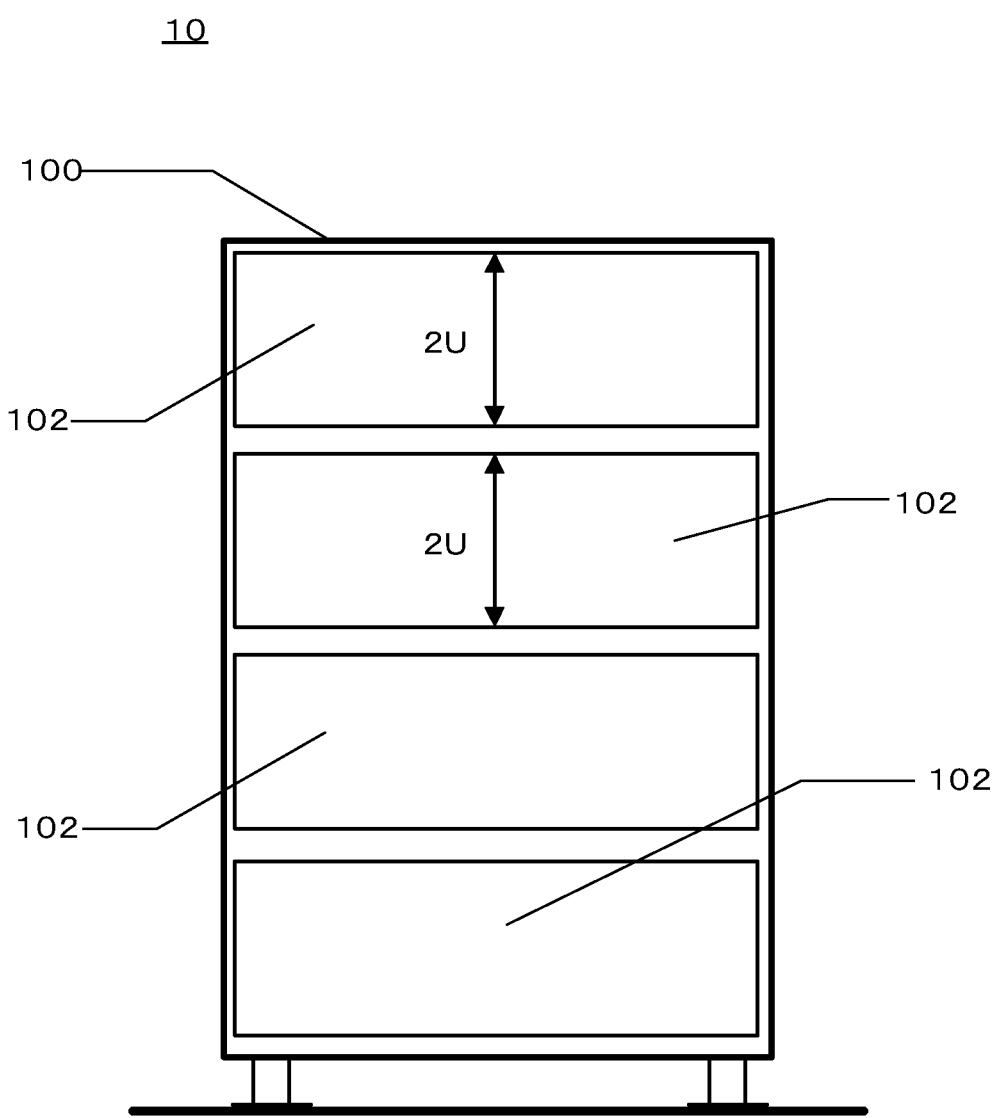
FIG. 4 is a front cross-sectional view showing an illustrative cooling apparatus according to the first embodiment.

As shown in FIGS. 3 and 4, for example, four electronic devices 102 each having a height of, for example, 2 U are loaded in the rack 100 along the height direction of the rack 100 with respective exhaust outlets of the electronic devices 102 being directed to the rear door 104 of the rack 100.

Figure 5:
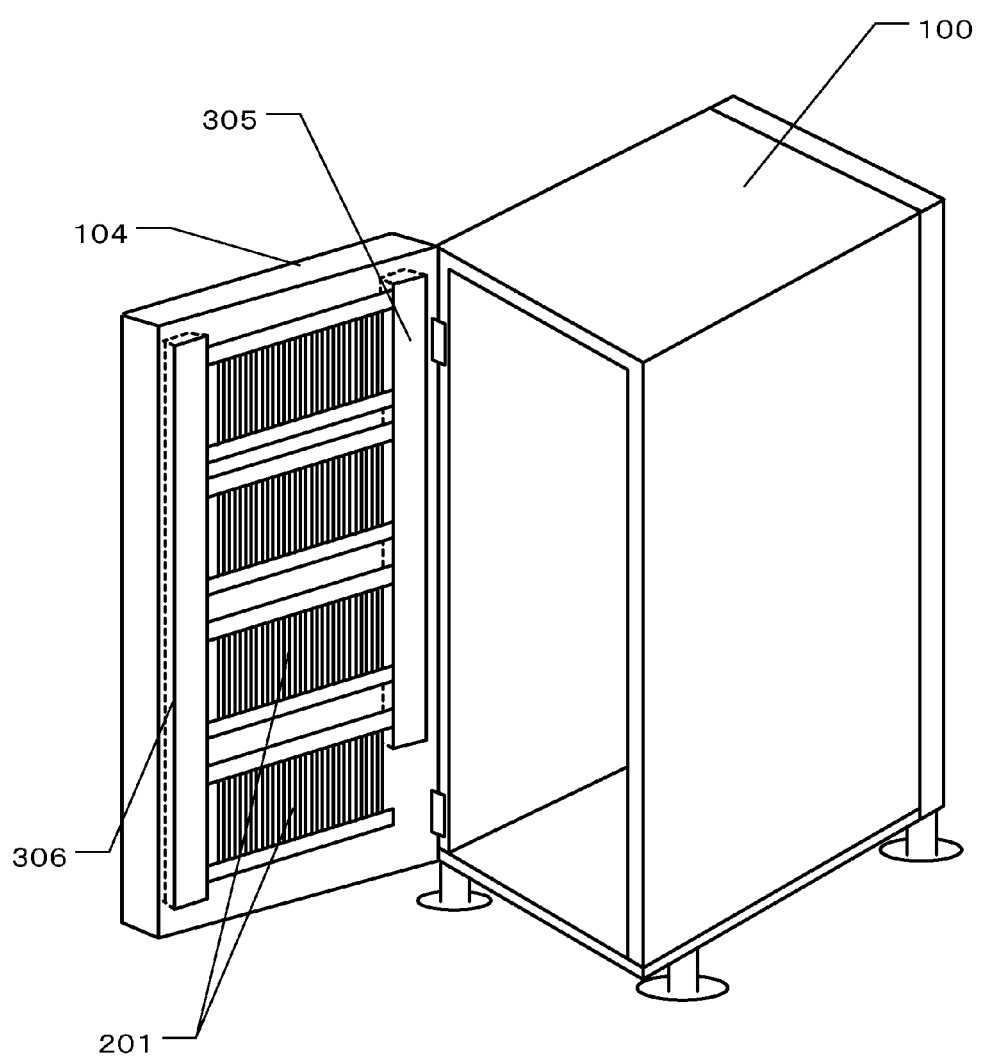
FIG. 5 is a perspective view showing an illustrative cooling apparatus placed on a rear door according to the first embodiment.

The evaporator units 201 are disposed in, for example, four by three layout in the height direction of the rack 100 and in the width direction of the rack 100 as shown in FIGS. 3 and 1, respectively. As shown in FIG. 5, the evaporator units 201 are fastened to the interior of the rear door 104 by screws, etc. That is, the evaporator units 201 are installed between the rear door 104 of the rack 100 and respective exhaust outlets of the electronic devices 102.

Figure 6:
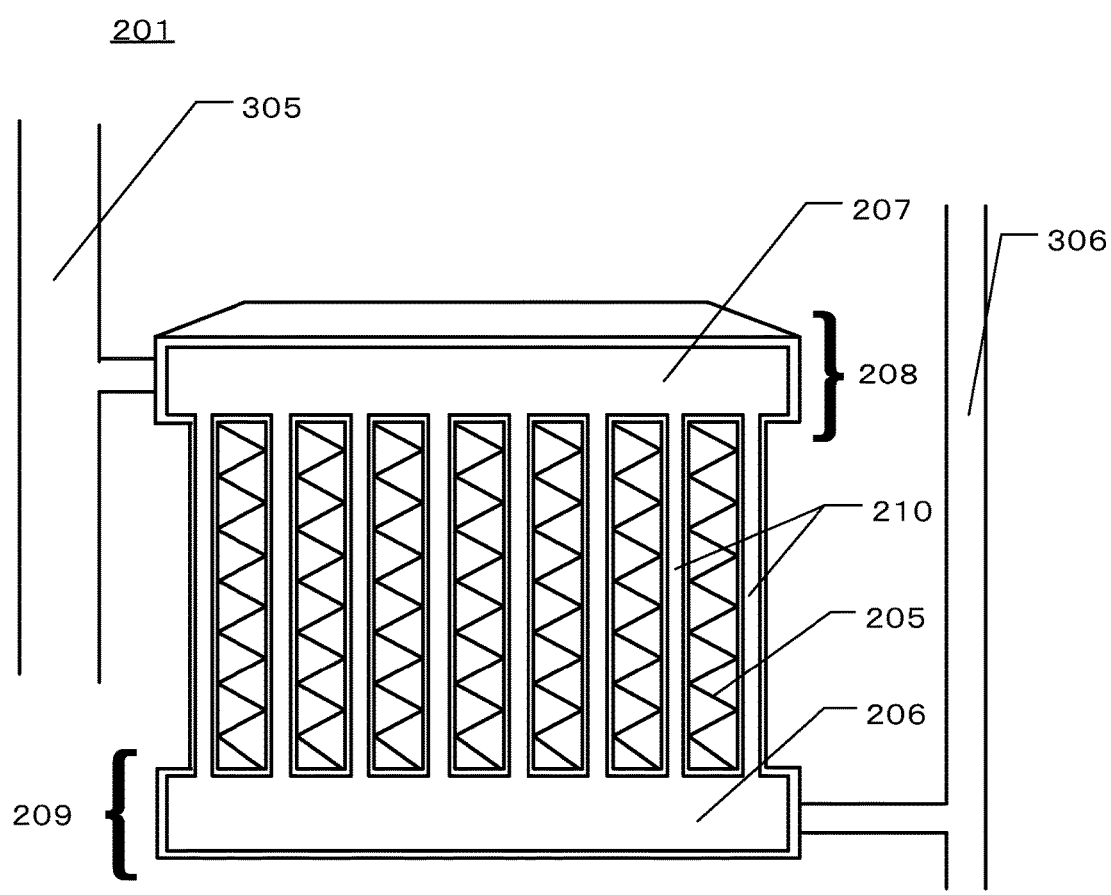
FIG. 6 is a front cross-sectional view showing an evaporator unit of the cooling apparatus according to the first embodiment.

As shown in FIG. 6, the evaporator unit 201 includes a coolant vapor tank 208 for reserving a coolant vapor 207, a coolant fluid tank 209 for reserving a coolant fluid 206 and provided below the coolant vapor tank 208, a plurality of coolant tubes 210 in a straight pipe shape for letting the coolant vapor tank 208 and the coolant fluid tank 209 to be communicated with each other, and disposed side by side in the width direction of the rack 100, and heat receiving fins 205 provided between the adjoining coolant tubes 210 and attached so as to thermally contact the coolant tubes 210. A coolant is filled in the coolant vapor tank 208, the coolant fluid tank 209, and the coolant tubes 210. The plurality of coolant tubes 210 is disposed in the width direction of the rack 100 at a predetermined interval. The evaporator unit 201 has a plurality of openings which is the gaps corresponding to respective intervals between the adjoining coolant tubes 210 and partitioned and formed by the heat receiving fins 205 in the height direction of the rack. The rear door 104 is formed with an opening for evacuation, and an exhaust air 105 from the electronic device 102 passes through the plurality of openings of the evaporator unit 201 and the opening of the rear door 104 for evacuation, and is evacuated to the exterior of the rack 100. The exhaust air 105 from the electronic device 102 causes the heat receiving fins 205 and the coolant tubes 210 to perform heat exchange with the exhaust air 105 when passing through the plurality of openings of the evaporator unit 201, and the coolant fluid 206 flowing in the coolant tubes 210 is vaporized due to the heat produced by the heat exchange. The exhaust air 105 from the electronic device 102 is cooled during the vaporization process of the coolant.

The coolant has a low boiling point and an insulation properties, such as fluorocarbon and a hydrofluoroether. Moreover, in order to make the boiling point lowered, when the coolant is filled in a coolant filling part, the coolant is enclosed with such a part being subjected to a pressure reduction close to a vacuum condition. The reason why the boiling point is lowered is to enable the cooling of the exhaust air 105 utilizing latent heat even if the amount of heat exhaustion by the exhaust air 105 is small.

The coolant vapor tank 208 is a hollow container formed of a metal, and is connected to a vapor piping 305 placed in the rack 100 or at the rear door 104 via a hose or a metal piping, etc. The coolant vapor tank 208 temporarily accumulates the coolant vapor 207 produced in the coolant tubes 210. The coolant vapor 207 accumulated in the coolant vapor tank 208 moves to the vapor piping 305 due to the pressure gradient of the coolant vapor 207 produced in the coolant tubes 210. The detail of this operation will be explained later.

The coolant fluid tank 209 is a hollow container formed of a metal, and is connected to a fluid piping 306 placed in the rack 100 or at the rear door 104 via a hose or a metal piping, etc. The coolant fluid tank 209 temporarily reserves the coolant fluid 206 having a low boiling point to be flown to respective coolant tubes 210. The coolant fluid 206 reserved in the coolant fluid tank 209 is refilled via the fluid piping 306. This operation will be explained in more detail later.

The heat receiving fins 205 are metallic corrugated fins, etc., and are joined with respective coolant tubes 210 by brazing, soldering, etc. The heat receiving fins 205 receive heats produced in the electronic device 102 from the exhaust air 105 passing through the openings of the evaporator unit 201, and transmit the heat to the coolant tubes 210. The heat receiving fins 205 also reinforce the strength of the coolant tubes 210.

When the fin pitch of the heat receiving fins 205 is small, the heat transfer surface area becomes large, and thus the amount of heat transported from the exhaust air 105 increases. However, when the fin pitch is small, the openings of the evaporator unit 201 become small, and thus the resistance for letting air to pass therethrough increases, thereby decreasing the speed of the exhaust air 105 at respective openings. Hence, the exhaust air 105 is not smoothly evacuated to the exterior of the rack 100, the temperature inside the rack 100 is likely to increase, and the heat in the electronic device 102 is not easily eliminated. This may cause the components, such as an LSI (Large Scale Integration) and an IC (Integrated Circuit), to have a temperature exceeding a temperature (i.e., an allowable temperature) at which such components can operate normally. Accordingly, it is desirable that the fin pitch of the heat receiving fins 205 should be set within a range below the allowable temperature of such components.

The coolant tubes 210 are each formed of a metal like aluminum, and disposed side by side in the width direction of the rack 100 at a predetermined interval. The coolant tubes 210 are each a passage of the coolant (the coolant fluid 206 and the coolant vapor 207), cause the coolant fluid 206 flowing out from the coolant fluid tank 209 to change the phase by the heat from the exhaust air 105 to become the coolant vapor 207, and guide the coolant vapor 207 to the coolant vapor tank 208 by the pressure gradient thereof.

According to this embodiment, as shown in FIG. 1, for example, four evaporator units 201 are disposed in the height direction of the rack 100 and three evaporator units 201 are disposed in the width direction of the rack 100, and a total of 12 evaporator units are disposed. Each evaporator unit 201 has a dimension in height of 2 U. The coolant vapor tank 208 and the coolant fluid tank 209 of each evaporator unit 201 may be interconnected with those of the evaporator unit 201 disposed at the same height of the rack. FIG. 1 shows illustrative such interconnection.

The fluid piping 306 is common to the coolant fluid tanks 209 of the four stages, and is connected to the coolant fluid tank 209 of each stage, and the vapor piping 305 is common to the coolant vapor tanks 208 of the four stages, and is connected to the coolant vapor tank 208 of each stage. The vapor piping 305 and the fluid piping 306 are each a metal piping, and the vapor piping 305 has an internal diameter that is from twice to several times as much as the internal diameter of the fluid piping 306 in order to maintain the boiling point of the coolant to be low and to suppress the pressure increase due to a volume expansion of the coolant 206 when the coolant changes the phase thereof to the coolant vapor 207.

Figure 7:
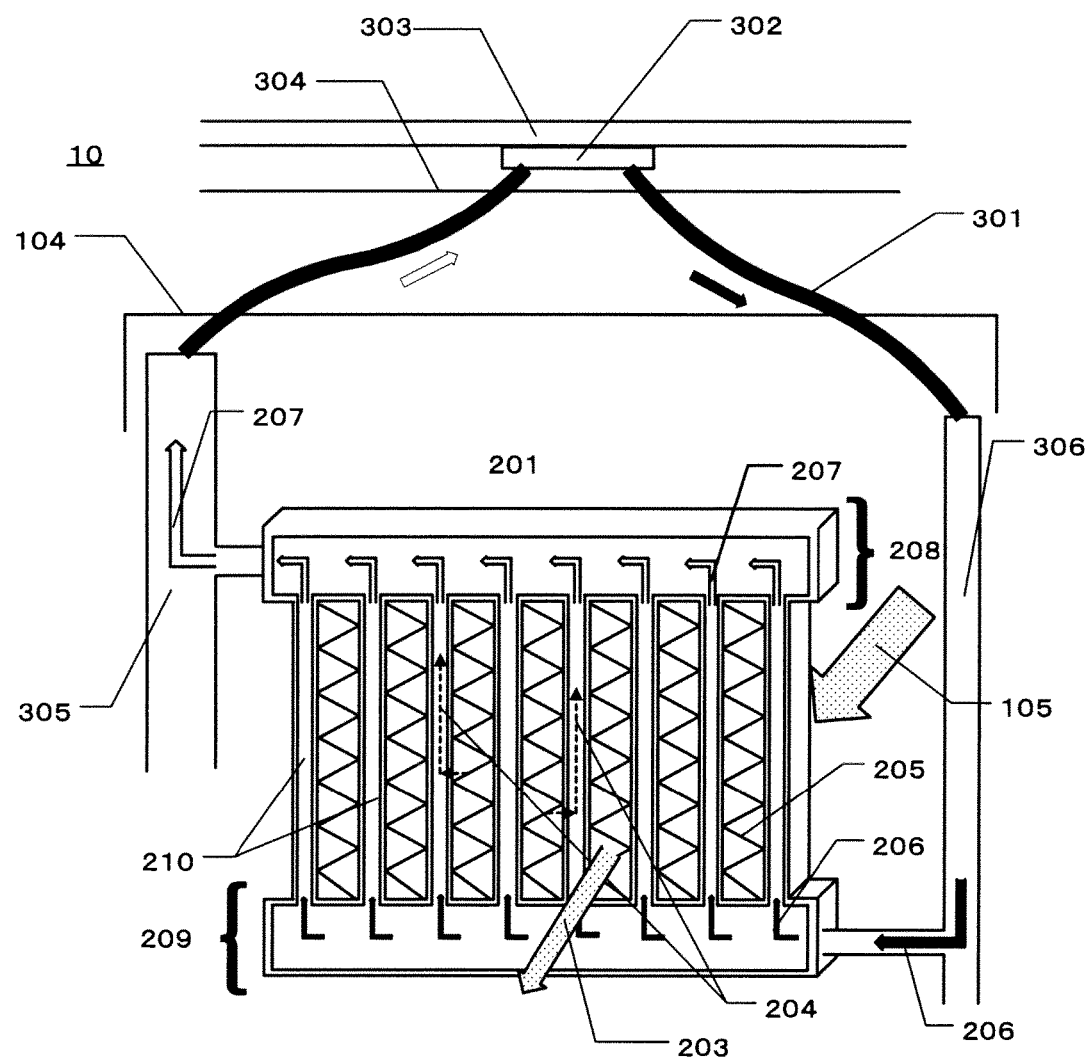
FIG. 7 is a cross-sectional perspective view showing an illustrative evaporator unit of the cooling apparatus according to the first embodiment.

Next, with reference to FIG. 7, an explanation will be given of an operation of the cooling apparatus 10 according to the first embodiment. In FIG. 7, a direction of the flow of the coolant fluid 206 is indicated by a black arrow, and a direction of the flow of the coolant vapor 207 is indicated by a white arrow.

According to the cooling apparatus 10 of the first embodiment, the vapor piping 305 and the fluid piping 306 are connected to a condenser unit 302 provided outside the rack 100 via respective connecting portions 301 each of which is a hose or a metal piping, etc., and the cooling apparatus is used with the coolant enclosed in the condenser unit 302, the vapor piping 305, and the fluid piping 306, respectively. The coolant is a coolant used by the evaporator unit 201 as will be explained below.

First, the coolant fluid 206 is supplied from the fluid piping 306 provided at the rear door 104 to the coolant fluid tank 209 of each evaporator unit 201. The coolant fluid 206 supplied to the coolant fluid tank 209 flows through the interiors of the plurality of coolant tubes 210 communicated with the coolant fluid tank 209 and the coolant vapor tank 208 provided thereabove toward the coolant vapor tank 208.

The exhaust air 105 from each electronic device 102 causes the heat receiving fins 205 and the coolant tubes 210 to perform heat exchange with the exhaust air 105 when passing through the openings of the evaporator unit 201, and is cooled. The heat receiving fins 205 which have received heat from the exhaust air 105 transfer the heat to the coolant tubes 210 by heat conduction, and the coolant tubes 210 increase the temperature of the coolant fluid 206 in the coolant tubes 210 by the heat transferred from the heat receiving fins 205 together with the heat directly received from the exhaust air 105. When the temperature of the coolant fluid 206 increases and exceeds the boiling point of the coolant fluid 206, the coolant fluid 206 changes the phase to the coolant vapor 207. Because of such a phase change, heat in the exhaust air 105 is utilized as latent heat and becomes boiling-cooling exhaust heat 204 which is thermally transferred. The boiling-cooling exhaust heat 204 means heat transport for performing cooling by utilizing latent heat at the time of boiling and for dissipating target heat. The heat transport utilizing the latent heat increases the cooling performance. When the temperature of the coolant vapor 207 is lower than the temperature of the exhaust air 105, such heat transport is also carried out by the temperature rise of the coolant vapor 207. The amount of heat not transported in both circumstances is dissipated in the form of the exhaust air 105 to the exterior of the rack 100 as rack exhaust heat 203.

Since the coolant is enclosed with a condition having undergone a pressure reduction close to a vacuumed condition, the boiling point becomes lower than a boiling point in an ambient air environment, when the electronic device 102 generates heats and the temperature of the exhaust air 105 from the electronic device 102 increases even slightly, the coolant immediately vaporizes, making the heat transport utilizing the latent heat enabled. The coolant vapor 207 produced through the phase change of the coolant fluid 206 inside the coolant tubes 210 goes up inside the coolant tubes 210 because of the buoyance of the vapor in the coolant fluid 206, and is guided to the coolant vapor tank 208.

The coolant vapor 207 guided to the coolant vapor tank 208 is guided to the vapor piping 305 provided in the rear door 104 because of the pressure gradient.

The coolant vapor 207 guided to the vapor piping 305 flows toward the condenser unit 302 provided outside the rack 100. The coolant vapor 207 guided to the condenser unit 302 is cooled by a cooling unit 303 next to the condenser unit 302, and changes the phase to the coolant fluid 206 in the condenser unit 302. The coolant fluid 206 produced in the condenser unit 302 by the phase change is supplied again to the coolant fluid tank 209 of the evaporator unit 201 through the fluid piping 306 (the detail of the condenser unit 302 and the cooling unit 303 will be discussed in a fifth embodiment later).

According to this configuration, the coolant vapor 207 produced in the coolant tubes 210 by the phase change goes up inside the coolant tubes 210. According to the first embodiment, since the coolant tubes 210 are each formed in a straight piping shape, in comparison with coolant tubes conventionally used well and formed in a spiral shape, the coolant vapor 207 produced in the coolant tubes 210 can be quickly discharged from the evaporator unit 201 to the vapor piping 305, and the amount of coolant vapor 207 accumulated in the evaporator unit 201 can be reduced. Accordingly, the length of the portion of the upper part of each evaporator unit 201 where the cooling performance decreases can be reduced, thereby efficiently cooling the whole exhaust air from the electronic devices 102 in the rack 100.

According to the above-explained example, the explanation was given of the case in which the dimension in height of the electronic device 102 and the dimension in height of the evaporator unit 201 are consistent with each other, but it is not always necessary that the dimension in height of the evaporator unit 201 matches the dimension in height of the electronic device 102.

A discussion will be given of an appropriate height of the evaporator unit 201.

The amount of coolant vapor 207 accumulated in the evaporator unit 201 becomes smaller as the dimension in height of the evaporator unit 201 becomes smaller. However, when the evaporator unit 201 is constructed with a dimension in height smaller than 2 U, the ratio of the coolant vapor tank 208 and the coolant fluid tank 209 to the evaporator unit 201 increases, and thus the ratio of the heat receiving fins 205 relative to the whole evaporator unit 201 extremely decreases, resulting in the reduction of the amount of heat to be received. Hence, in comparison with a case in which the dimension in height is 2 U, the cooling performance of the evaporator unit 201 per a unit area decreases.

Conversely, the larger the dimension in height of the evaporator unit 201 is, the more the amount of heat to be received becomes, but the amount of the coolant vapor 207 accumulated in the evaporator unit 201 increases. Accordingly, there is a possibility that the exhaust air from some of the electronic devices 102 loaded in the rack is not sufficiently cooled. In order to eliminate such a possibility, it is necessary to limit the maximum dimension in height of the evaporator unit 201. More specifically, since the minimum dimension in height of the electronic device 102 loaded in the rack is 1 U, it is necessary for the evaporator unit 201 to be constructed with a dimension in height so that the coolant vapor 207 is not accumulated beyond the length of equal to or longer than 1 U in the height direction of the rack.

Figure 8:
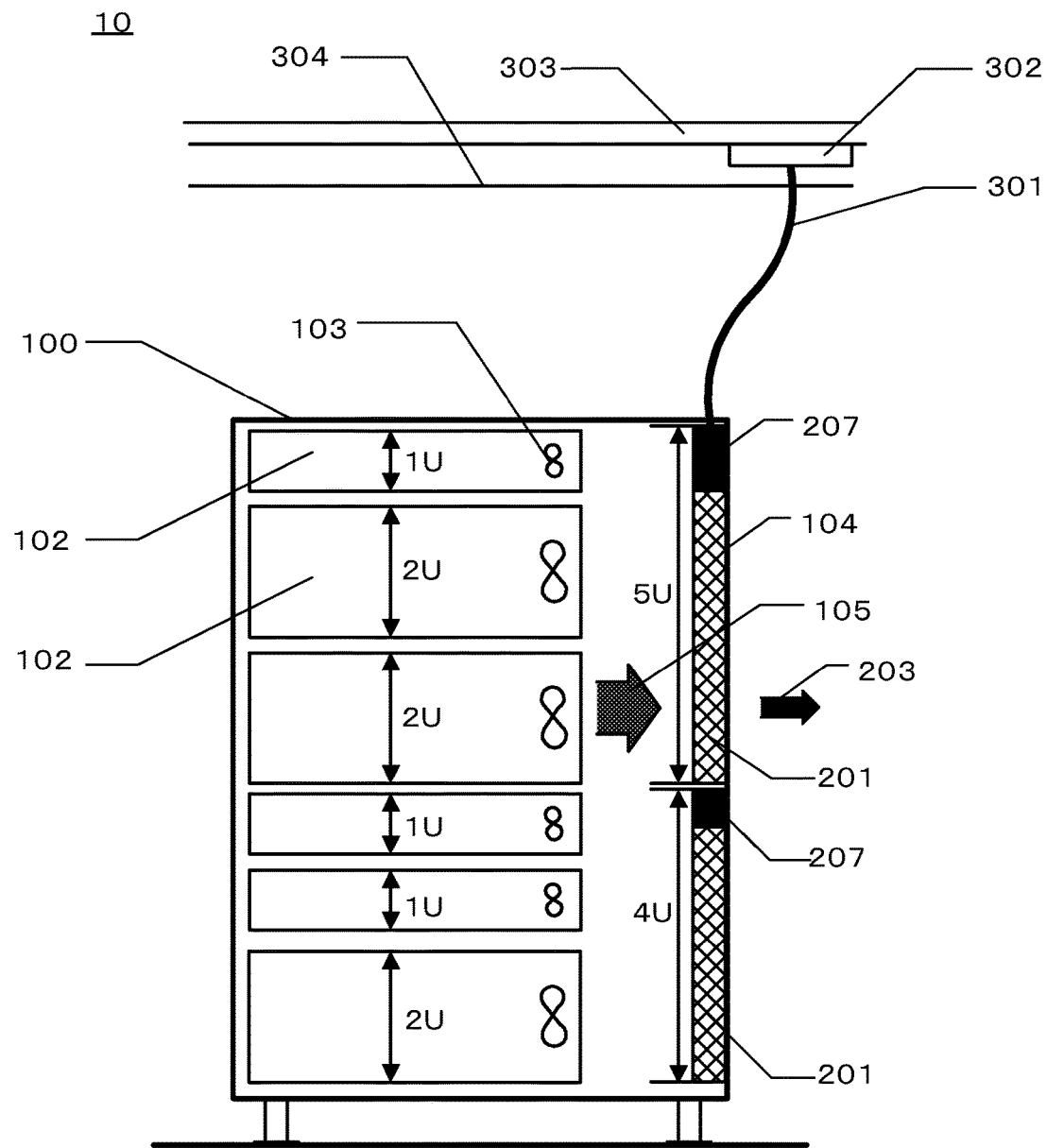
FIG. 8 is a diagram for explaining a suitable height of the evaporator unit of the cooling apparatus according to the first embodiment.

When the evaporator unit 201 is constructed with a dimension in height of 5 U, depending on the operation time of the electronic device 102 loaded in the rack and the operation status of such an electronic device, the coolant vapor 207 is likely to be accumulated in the evaporator unit 201 beyond the height of equal to or larger than 1 U. In this case, accordingly, the exhaust air from the electronic device 102 with a dimension in height of 1 U loaded in the rack at the substantially same height as that of the portion where the coolant vapor 207 is accumulated is not sufficiently cooled. For example, as shown in FIG. 8, a case in which one evaporator unit 201 with a dimension in height of 5 U and one evaporator unit 201 with a dimension in height of 4 U are disposed and the electronic device 102 with a dimension in height of 1 U is put on the uppermost stage of the rack 100 corresponds to such an example.

When the electronic device 102 is equipped with the evaporator unit 201 as an associated unit, if the dimension in height of the electronic device 102 increases, the dimension in height of the evaporator 201 also increases, and thus the above-explained technical issue occurs. In this case, among the exhaust air from such an electronic device 102, the exhaust air from the upper part of the electronic device is insufficiently cooled.

Moreover, the electronic device 102 loaded in the rack 100 is designed and manufactured at a dimension in height in the unit U defined in the EIA standards, and mainly has a dimension in height from 1 U to 4 U. Hence, according to the above-explained reason, in order to efficiently absorb heat dissipated from the electronic device 102 having a dimension in height of equal to or larger than 1 U, it is desirable that the evaporator unit 201 should have a dimension in height larger than 1 U. The rack 100 is designed and manufactured so as to have a dimension in height in the unit U defined by the EIA standards. Hence, it is desirable that the dimension in height of the evaporator unit 201 should be designed in the unit U, and be any one of 2 U, 3 U, and 4 U.

When the dimension in height of the evaporator unit 201 is set in this manner, the evaporator unit 201 can be loaded in the rack 100 with a good spatial efficiency, and the exhaust air 105 from each electronic device 102 can be efficiently and uniformly cooled regardless of the dimension in height of the electronic device 102 and the layout thereof in the rack 100. Moreover, even if the dimension in height of the electronic device 102 is large, the exhaust air therefrom can be efficiently and uniformly cooled. As a result, the amount of exhaust heat 203 to the exterior of the rack 100 can be reduced, and thus the temperature rise of the room where the rack 100 is installed can be suppressed. Moreover, it becomes possible to suppress a formation of a place so-called a hot spot where the temperature is locally high. Accordingly, sufficient cooling of the electronic devices 102 through air cooling is enabled.

<Modified Example>

Figure 9:
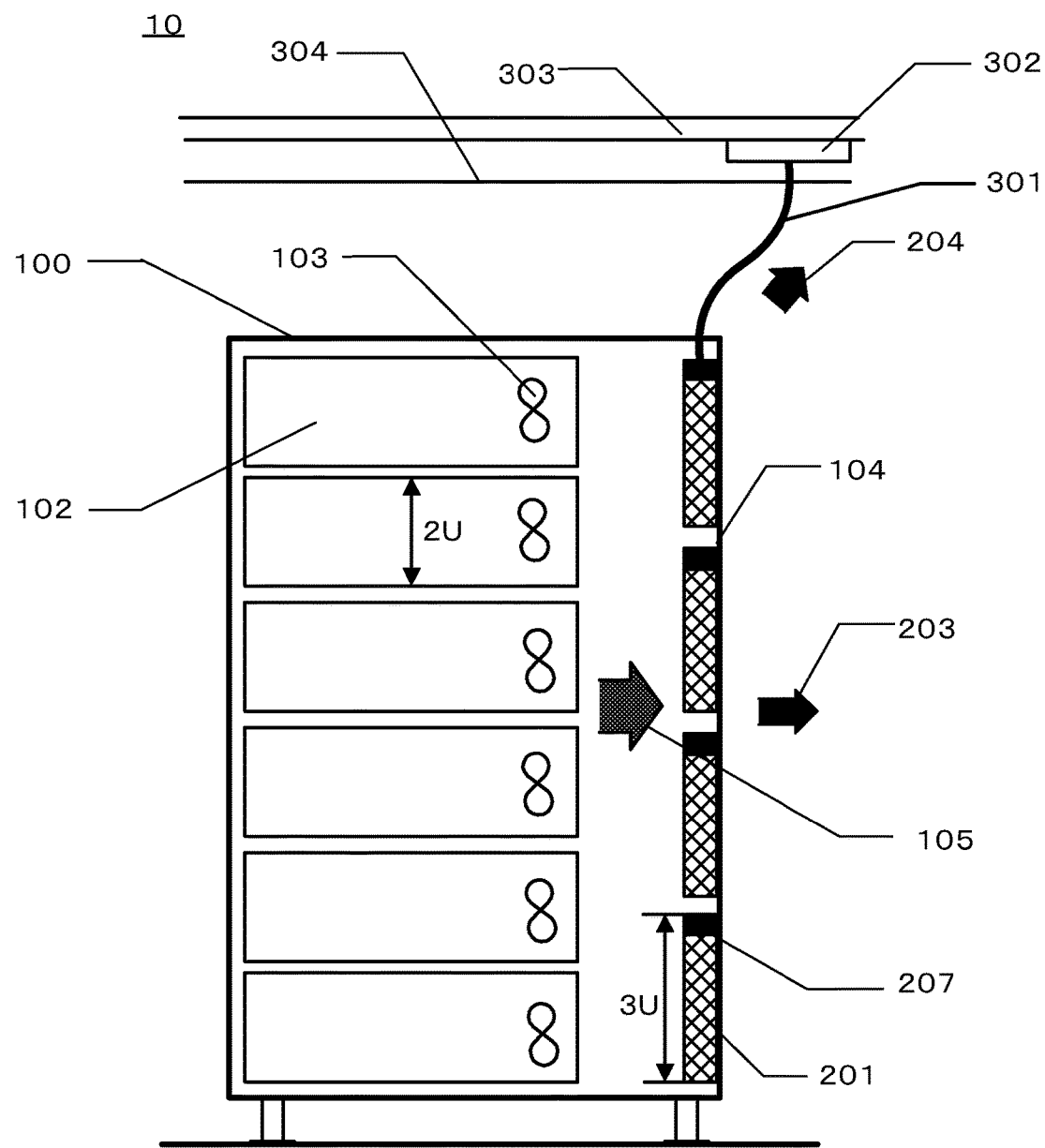
FIG. 9 is a side cross-sectional view showing a modified example of the cooling apparatus shown in FIG. 1.

The present invention is not limited to the above-explained example, and can be changed and modified in various forms. For example, the explanation was given of the example case in which the dimension in height of the electronic device 102 and the dimension in height of the evaporator unit 201 are consistent with each other, but it is not always necessary that the dimension in height of the electronic device 102 matches the dimension in height of the evaporator unit 201. With respect to the dimension in height of the evaporator unit 201 disposed in advance, the dimension in height of the electronic device 102 loaded in the rack 100 is optional per a unit 1 U. For example, as shown in FIG. 9, when four evaporator units 201 with a dimension in height of 3 U are disposed along the height direction of the rack, six electronic devices 102 with a dimension in height of 2 U may be placed along the height direction of the rack.

The above explanation was given of the example case in which the three evaporator units 201 are disposed in the width direction of the rack 100, but the number of the rack 100 placed in the width direction of the rack 100 is not limited to any particular number and is optional. Moreover, the dimension in width of each evaporator unit 201 is also optional.

The above explanation was given of the example case in which the coolant fluid 206 is circulated without controlling a flow volume, but various sensors and valves may be provided at the passage where the coolant circulates. The cooling apparatus 10 may have an input unit into which respective outputs are input from various sensors, and a control unit which determines the operation condition of the electronic device 102 based on respective outputs by various sensors, and which controls opening/closing of the valves in accordance with the determined operation condition of the electronic device 102 to change the flow volume of the coolant fluid 206.

According to the cooling apparatus 10 of the first embodiment, the evaporator units 201 of multi stages are disposed in the height direction of the rack 100 at portions of the rack 100 between the exhaust air blowing outlet from the electronic device 102 and the rear door 104, and the dimension in height of the evaporator unit 201 of each stage is set to be any of 2 U, 3 U, and 4 U. Hence, the exhaust air from the electronic devices 102 loaded in the rack 100 along the height direction thereof can be efficiently cooled regardless of the dimension in height of the electronic device 102 loaded in the rack 100 and the layout of such electronic devices 102.

<Second Embodiment>

Figure 10:
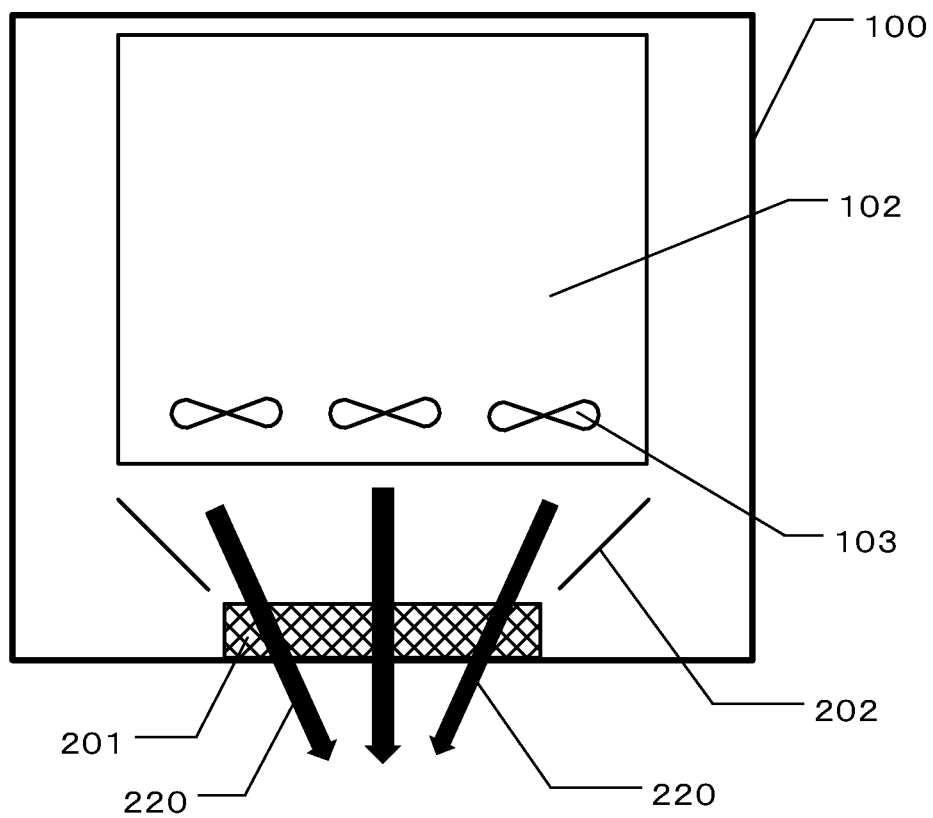
FIG. 10 is a top cross-sectional view showing an illustrative rack equipped with a cooling apparatus according to a second embodiment of the present invention.

A cooling apparatus 20 according to a second embodiment has an air-guiding member 202 between the electronic device 102 and the evaporator unit 201. The air-guiding member 202 adjusts and guides the exhaust air from the electronic device 102 to the direction toward the exhaust-air inflow surface of the evaporator unit 201. In particular, when, as shown in FIG. 10, the dimension in width of the evaporator unit 201 is shorter than the dimension in width of the electronic device 102, the air-guiding member 202 is useful. The electronic device 102 loaded in the rack 100 has the dimension in width defined by the EIA standards, which is 19 inches (482.6 mm). In the second embodiment, illustration and explanation of the same component and configuration as those of the first embodiment are omitted.

The air-guiding member 202 is, for example, two air-guiding plates. The air-guiding plate is formed of, for example, a metal material, but the material to be used is not limited to any particular one. The air-guiding unit 202 guides the exhaust air from the electronic device 102 to the direction of an exhaust air arrow 220, and thus the two air-guiding plates are disposed between the electronic device 102 and the evaporator unit 201 in, for example, a reversed triangular orientation as shown in FIG. 10.

The exhaust air from the electronic device 102 is collected to the direction of the exhaust air arrow 220, i.e., to a surface of the evaporator unit 201 where the exhaust air should flow in by the air-guiding member 202 provided between the electronic device 102 and the evaporator unit 201.

Since the cooling performance of the evaporator unit 201 increases as the amount of exhaust air heat increases within the range of the latent heat of the coolant, the cooling performance of the evaporator unit 201 per a unit area increases when the air-guiding member 202 collects the exhaust heat from the electronic device 102 to the evaporator unit 201, and the electronic device 102 can be efficiently cooled. Accordingly, the dimension in width of the evaporator unit 201 can be reduced. Hence, the total area of the evaporator unit 201 in the rack 100 can be reduced, which is preferable from the standpoint of the installation costs of the evaporator unit 201.

<Third Embodiment>

Figure 11:
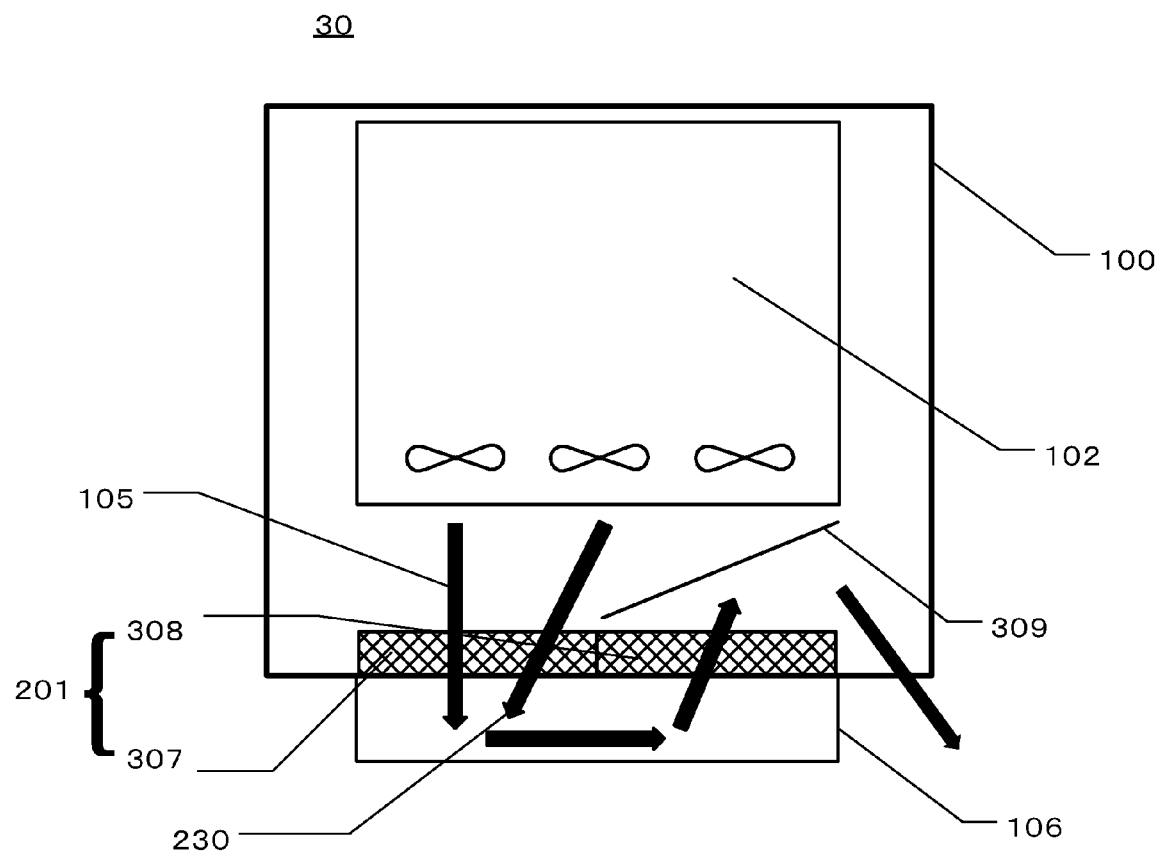
FIG. 11 is a top cross-sectional view showing an illustrative rack equipped with a cooling apparatus according to a third embodiment of the present invention.

As shown in FIG. 11, a cooling apparatus 30 according to a third embodiment has the evaporator unit 201 which is segmented into a first evaporator unit 307 and a second evaporator unit 308 in the width direction of the rack, and has an air-guiding member 309 which straightens the exhaust air from the electronic device 102 to the first evaporator unit 307 and which is provided between the electronic device 102 and the exhaust-air inflow surface of the first evaporator unit 307 like the second embodiment. The air-guiding member 309 adjusts and guides the exhaust air from the electronic device 102 toward the direction of the exhaust-air inflow surface of the first evaporator unit 307.

Moreover, a flow-direction changing member 106 that guides the exhaust air from the electronic device 102 passing through the first evaporator unit 307 to a surface of the second evaporator unit 308 opposite to the exhaust-air inflow surface of the first evaporator unit 307 is provided at the opposite side of the exhaust-air inflow surface with reference to the first evaporator unit 307. In the third embodiment, illustration and explanation of the same component and configuration as those of the first embodiment are omitted.

The air-guiding member 309 is, for example, an air-guiding plate disposed on a straight line interconnecting a boundary between the first evaporator unit 307 and the second evaporator unit 308 and one end of the electronic device 102. The air-guiding plate is formed of, for example, a metal material, but the material to be used is not limited to any particular one.

The flow-direction changing member 106 is, for example, a metallic cover or duct covering the first evaporator unit 307 and the second evaporator unit 308 at the opposite side to the side of the electronic device 102, and guides the exhaust air from the electronic device 102 passing through the first evaporator unit 307 to the second evaporator unit 308. It is not necessary that the flow-direction changing member 106 is formed of a metal, but the flow-direction changing member 106 can be formed of any material.

The exhaust air 105 from the electronic device 102 is caused to flow to the direction of an exhaust air arrow 230 by the surface of the air-guiding member 309 (the surface at the electronic-device-102 side), and passes through the first evaporator unit 307. Next, the direction of the exhaust air 105 is changed by the flow-direction changing member 106, and the exhaust air is guided to the second evaporator unit 308. The amount of heat not subjected to heat exchange by the first evaporator unit 307, i.e., the exhaust heat from the electronic device 102 not utilized for heat transportation by the coolant and exhausted to the exterior of the rack is subjected to heat exchange again by the second evaporator unit 308. Hence, the total heat exchange amount by the evaporator units 307 and 308 can be increased. Accordingly, the exhaust air from the electronic device 102 can be efficiently cooled.

The exhaust air passing through the second evaporator unit 308 is reflected by the rear surface (the surface opposite to the electronic-device-102 side) of the air-guiding member 309, and is evacuated to the exterior of the rack 100 through the opening provided in the rear door 104 of the rack 100. It is not illustrated in the figure but the rack 100 may be equipped with a plurality of evaporator units each employing the same configuration as that of the evaporator unit 201 in an overlapped manner in the direction of the exhaust air from the electronic device 102 in such a way that the exhaust air 105 passes through the plurality of evaporator units. In this case, the air-guiding member 309 and the flow-direction changing member 106 may be omitted. In this case, however, the air-guiding member 202 may be placed, and when the whole width of the evaporator unit 201 is smaller than the width of the electronic device 102, the air-guiding member 202 shown in FIG. 10 can be used together with the above-explained configuration.

<Fourth Embodiment>

Figure 12:
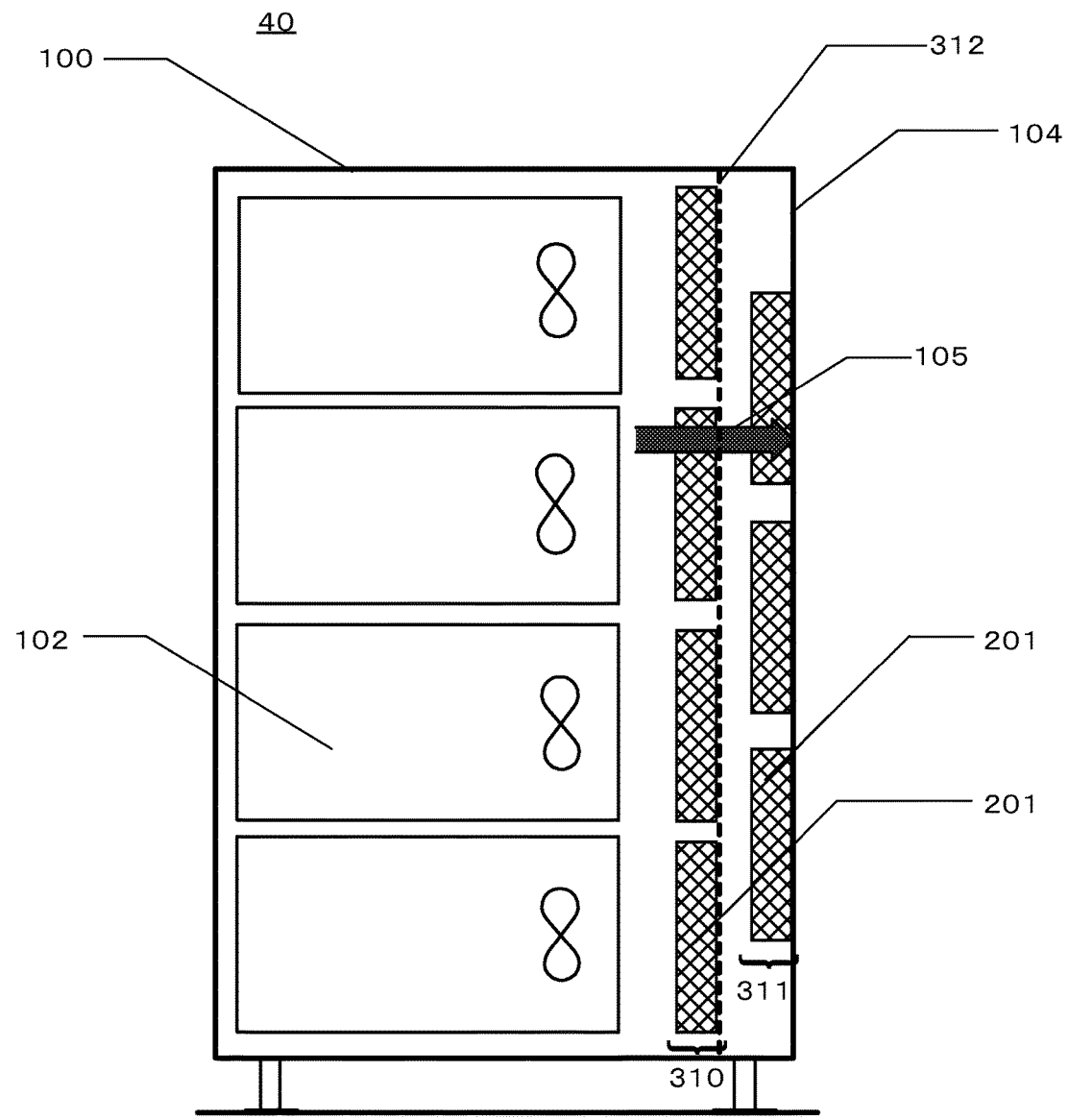
FIG. 12 is a side cross-sectional view showing an illustrative rack equipped with a cooling apparatus according to a fourth embodiment of the present invention.

As shown in FIG. 12, a cooling apparatus 40 according to a fourth embodiment has the evaporator units 201 of multi stages provided along the height direction of the rack 100 and configuring a first layer 310 and a second layer 311 from the electronic devices 102 to the rear door 104 in this order. The first layer 310 includes the evaporator units 201 of four stages, while the second layer 311 includes the evaporator units 201 of three stages. Moreover, each evaporator unit 201 of the second layer 311 is disposed in a so-called zig-zag layout so as to overlap with a boundary between the adjoining evaporator units 201 in the vertical direction in the first layer 310. In the fourth embodiment, illustration and explanation of the same component and configuration as those of the first embodiment are omitted.

Each evaporator unit 201 of the first layer 310 is fastened, by means of screws and/or the like, to an inner door 312 and/or the like provided between the electronic devices 102 and the rear door 104 and permitting ventilation.

The exhaust air 105 from the electronic device 102 passes through the first layer 310, and then flows in the second layer 311. For example, even if the exhaust air 105 from the electronic device 102 passes through the upper part of the evaporator unit 201 of the first layer 310 filled with the coolant vapor or the clearance between the upper and lower evaporator units 201, and is not sufficiently cooled, when such an exhaust air passes through the lower part of the evaporator unit 201 of the second layer 311 filled with the coolant fluid, the exhaust air can be sufficiently cooled. Accordingly, when the evaporator units 201 are disposed in this layout, the exhaust air 105 from the electronic device 102 can be further efficiently cooled in comparison with a case in which the evaporator units 201 are simply disposed doubly in the direction of the exhaust air 105 from the electronic device 102.

Each evaporator unit 201 of the first layer 310 may be attached to the rear door 104 together with the second layer 311 instead of the inner door 312.

<Fifth Embodiment>

Figure 13:
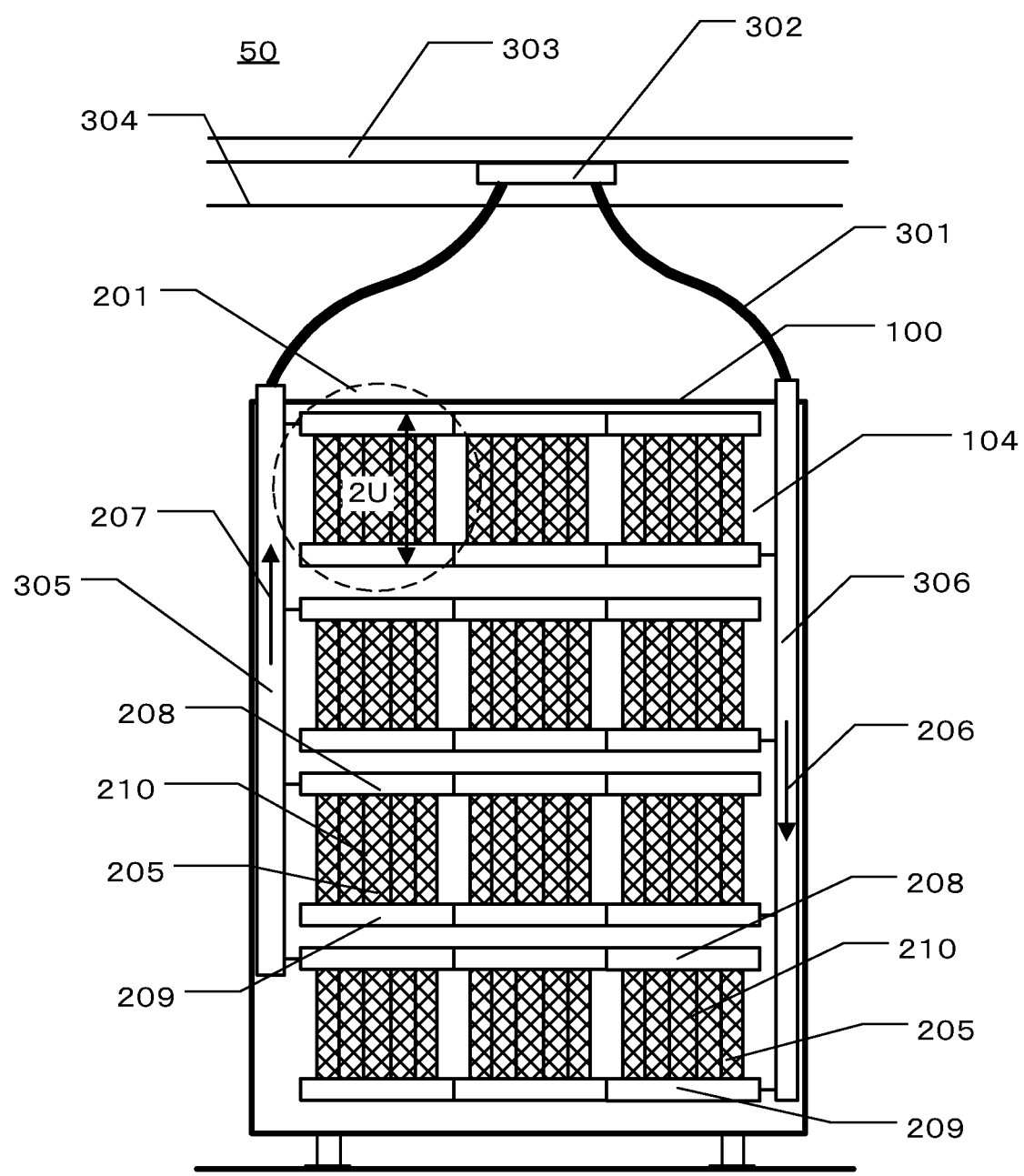
FIG. 13 is a rear cross-sectional view showing an illustrative cooling system according to a fifth embodiment of the present invention.

A fifth embodiment relates to a cooling system 50 including the cooling apparatus 10, 20, 30 or 40 explained in the first to fourth embodiments. As shown in FIG. 13, the cooling system 50 includes the cooling apparatus 10, 20, 30 or 40 explained in the first to fourth embodiments, the condenser unit 302 provided outside the rack 100, and a coolant (the coolant fluid 206 and the coolant vapor 207) which circulates between each evaporator unit 201 of the cooling apparatus 10, 20, 30 or 40 and the condenser unit 302 through the fluid piping 306 and the vapor piping 305. The same coolant as that of the above-explained evaporator unit 201 is used.

The condenser unit 302 is a part which cools and devolatilizes the coolant vapor 207, formed of aluminum or copper with a large thermal conductivity, and has an internal configuration that is a chamber configuration permitting circulation of the coolant. The condenser unit 302 is disposed adjacent to a cooling unit 303 for cooling the condenser unit 302. Moreover, the condenser unit 302 is connected to the fluid piping 306 and the vapor piping 305 by respective connecting portions 301 each of which is a hose or a metal piping.

The cooling unit 303 is a part for cooling the condenser unit 302, and is configured by, for example, a cold-water piping for an air conditioner and placed behind a room ceiling 304 of a room where the rack 100 is installed, such as a data center or a computer room.

The same coolant as that of the evaporator unit 201 is used, and is a coolant having a low boiling point and insulation properties, such as fluorocarbon and a hydrofluoroether. Moreover, in order to maintain the boiling point to be low in comparison with the boiling point in an ambient air environment, the coolant is enclosed in a system where the coolant circulates with such a system being subjected to a pressure reduction close to a vacuum condition.

The cooling system 50 operates as already explained in the first embodiment. That is, the evaporator unit 201 cools the exhaust air 105 from the electronic device 102, and thus the coolant fluid 206 in the coolant tube 210 changes the phase thereof to the coolant vapor 207. The coolant vapor 207 moves to the condenser unit 302 through the coolant vapor tank 208, the vapor piping 305, and the connecting portion 301 due to the buoyance of the coolant vapor 207 in the coolant fluid 208 and the pressure gradient of the coolant vapor 207. The condenser unit 302 is cooled by the cooling unit 303 through thermal conduction, and cools the coolant vapor 207 moved to the condenser unit 302. When cooled, the coolant vapor 207 changes the phase thereof to the coolant fluid 206. The coolant fluid 206 produced by the phase change is supplied to the coolant tubes 210 from the condenser unit 302 through the connecting portions 301 connected to the fluid piping 306, the fluid piping 306, and the coolant fluid tank 209.

<Modified Example>

According to the above-explained embodiments, the explanation was given of the cases in which the condenser unit 302 and the cooling apparatus are connected together in a one-to-one relationship, but a plurality of cooling apparatuses may be connected to one condenser unit 302.

The above-explained embodiments can be changed and modified without departing from the broad scope and spirit of the present invention. The above-explained embodiments are to illustrate the present invention, and are not intended to limit the scope and spirit of the present invention. The scope and spirit of the present invention are indicated by each claim of the appended claims rather than the above-explained embodiments. Various modifications within the range of equivalent to each claim should be included in the scope and spirit of the present invention.

Some of or all of the above-explained embodiments can be described as the following additional statements, but the present invention is not limited to the following additional statements.

<Additional Statement 1>

A cooling apparatus for electronic-device exhaustion which cools exhaust air from an electronic device loaded in a rack, the cooling apparatus for electronic-device exhaustion including: a plurality of evaporator units which is disposed in the rack along a height direction of the rack, cause a coolant fluid filled in each evaporator unit to vaporize and produce a coolant vapor by heat of the exhaust air flowing in and passing through each evaporator unit to cool the exhaust air; a first passage that is a supply route of the coolant fluid to each of the evaporator units; and a second passage that is a discharging route of the coolant vapor from each evaporator unit, in which a length of the evaporator unit in the height direction of the rack is any of 2 U, 3 U, and 4 U in accordance with a position where the evaporator unit is disposed in the height direction of the rack with 1 U being 44.45 mm, and the first passage and the second passage are commonly connected to the plurality of evaporator units.

<Additional Statement 2>

The cooling apparatus for electronic-device exhaustion according to additional statement 1, in which the evaporator unit includes: a coolant vapor tank that accumulates thereinside the coolant vapor; a coolant fluid tank which is provided downwardly of the coolant vapor tank and which accumulates thereinside the coolant fluid; a plurality of coolant tubes which communicates with the coolant fluid tank and the coolant vapor tank; and a heat receiving fin which is joined with the coolant tube and which receives heat from the exhaust air.

<Additional Statement 3>

The cooling apparatus for electronic-device exhaustion according to additional statement 2, in which each of the coolant tubes is a straight piping.

<Additional Statement 4>

The cooling apparatus for electronic-device exhaustion according to any one of additional statements 1 to 3, further including an air-guiding member which is disposed at a side of the evaporator unit where the exhaust air flows in and which adjusts and directs the exhaust air to the evaporator unit.

<Additional Statement 5>

The cooling apparatus for electronic-device exhaustion according to any one of additional statements 1 to 4, in which the evaporator units are disposed in a manner forming at least double layers of the evaporator units in a direction in which the exhaust air passes through.

<Additional Statement 6>

The cooling apparatus for electronic-device exhaustion according to additional statement 4, in which the evaporator units configure a first area and a second area segmented in a width direction of the rack, the air-guiding member adjusts and guides the exhaust air to the first area, but blocks the exhaust air to the second area, the cooling apparatus further comprises a flow-direction changing member which is provided at, with reference to the first area, an opposite side to a surface of the first area where the exhaust air flows in, and which guides the exhaust air having passed through the first area to a surface of the second area opposite to the surface of the first area where the exhaust air flows in.

<Additional Statement 7>

The cooling apparatus for electronic-device exhaustion according to additional statement 5, in which the double layers dispose the plurality of evaporator units configuring respective layers in a zig-zag layout to each other in the height direction of the rack.

<Additional Statement 8>

The cooling apparatus for electronic-device exhaustion according to additional statement 7, in which the zig-zag layout permits the exhaust air passing through a space between the adjoining evaporator units in the height direction of the rack among the plurality of evaporator units configuring one layer or a predetermined-length upper part of the evaporator unit located downwardly between the adjoining evaporator units to pass through a predetermined-length lower part of any evaporator unit configuring another layer.

<Additional Statement 9>

A cooling system for electronic-device exhaustion, the cooling system including: the cooling apparatus for electronic-device exhaustion according to any one of additional statement 1 to 8; a condenser unit disposed upwardly of the cooling apparatus for electronic-device exhaustion; and a coolant which circulates between the condenser unit and the cooling apparatus for electronic-device exhaustion, in which the condenser unit is connected to the first passage and the second passage in the cooling apparatus for electronic-device exhaustion.

INDUSTRIAL APPLICABILITY

The present invention can be applied to cooling of the exhaust air from electronic devices, such as a computer and a network device, operated in a manner loaded in a rack. Moreover, the present invention can be directly applied to a computer and a network device which are not loaded in a rack if the electronic device has an exhaust outlet for cooling a plurality of devices in the height direction. Furthermore, according to the present invention, the power for an air conditioner can be reduced, and thus the present invention can be applicable to an air-conditioner-related facility in a data center or a computer room.

DESCRIPTION OF REFERENCE NUMERALS

10 Cooling apparatus
20 Cooling apparatus
39 Cooling apparatus
40 Cooling apparatus
50 Cooling system
100 Rack
101 Rail
102 Electronic device
103 Fan
104 Rear door
105 Exhaust air
106 Flow-direction changing member
201 Evaporator unit
202 Air-guiding member
203 Rack exhaust heat
204 Boiling-cooling exhaust heat
205 Heat receiving fin
206 Coolant fluid
207 Coolant vapor
208 Coolant vapor tank
209 Coolant fluid tank
210 Coolant tube
220 Exhaust air arrow
230 Exhaust air arrow
301 Connecting portion
302 Condenser unit
303 Cooling unit
304 Room ceiling
305 Vapor piping
306 Fluid piping
307 First evaporator unit
308 Second evaporator unit
309 Air-guiding member
310 First layer
311 Second layer
312 Inner door

The invention claimed is:

1. A cooling apparatus for electronic-device exhaustion which cools exhaust air from an electronic device loaded in a rack by endothermic action of a coolant circulating via a condenser unit, the cooling apparatus comprising:
   a plurality of evaporator units disposed in the rack along a height direction of the rack, and configured to cause a coolant fluid filled in each evaporator unit to vaporize and produce a coolant vapor by heat of exhaust air flowing in and passing through the each evaporator unit to cool the exhaust air;
   a fluid pipe that is a supply route of the coolant fluid to the each evaporator unit; and
   a vapor pipe that is a discharging route of the coolant vapor from the each evaporator unit, wherein:
   the fluid pipe is provided on a surface of one side portion of the each evaporator unit, is coupled to an end of the one side portion on a lower part of the each evaporator unit, and is connected to the condenser unit, the vapor pipe includes a plurality of branched vapor pipes, each of the plurality of branched vapor pipes is a straight pipe and is provided on a surface of another side portion of the each evaporator unit and is coupled to an end of the another side portion on an upper part of the each evaporator unit, the one side portion and the another side portion are disposed on different sides of the each evaporator unit, the condenser unit is connected to and disposed above the cooling apparatus, the vapor pipe is connected to the condenser unit without having a portion downwardly extending from the plurality of evaporator units to the condenser unit, and a length of the each evaporator unit in the height direction of the rack is any of 2 U, 3 U, and 4 U, where 1 U is a unit of the height of the rack, in accordance with a position where the each evaporator unit is disposed in the height direction of the rack, wherein the each evaporator unit comprises:
- a coolant vapor tank that accumulates thereinside the coolant vapor;
- a coolant fluid tank which is provided downwardly of the coolant vapor tank and which accumulates thereinside the coolant fluid;
- a plurality of coolant tubes which communicates with the coolant fluid tank and the coolant vapor tank; and
- a heat receiving fin which is joined with the coolant tube and which receives heat from the exhaust air, wherein each of the coolant tubes is a straight piping, wherein the each evaporator units are disposed in a manner forming at least double layers of the evaporator units in a direction in which the exhaust air passes through, wherein the double layers dispose the plurality of evaporator units configuring respective layers in a zig-zag layout to each other in the height direction of the rack, wherein the zig-zag layout is an arrangement of first evaporator units and second evaporator units among the plurality of evaporator units such that the first evaporator units adjoin in the height direction of the rack to configure a first layer of the double layers, and the second evaporator units adjoin in the height direction of the rack to configure a second layer of the double layers, so that exhaust air passing through a space between the first evaporator units or exhaust air passing through an upper part of one of the first evaporator units passes through a lower part of any of the second evaporator units, the upper part having a first predetermined length and located downwardly from a space between the first evaporator units, the lower part having a second predetermined length.

2. The cooling apparatus for electronic-device exhaustion according to claim 1, further comprising an air-guiding member which is disposed at a side of the each evaporator unit where the exhaust air flows in and which adjusts and directs the exhaust air to the each evaporator unit.

3. The cooling apparatus for electronic-device exhaustion according to claim 2, wherein
the evaporator units configure a first area and a second area segmented in a width direction of the rack,
the air-guiding member adjusts and guides the exhaust air to the first area, but blocks the exhaust air to the second area,
the cooling apparatus further comprises a flow-direction changing member which is provided at, with reference to the first area, an opposite side to a surface of the first area where the exhaust air flows in, and which guides the exhaust air having passed through the first area to a surface of the second area opposite to the surface of the first area where the exhaust air flows in.

4. The cooling apparatus for electronic-device exhaustion according to claim 1, wherein 1 U is 44.45 mm.

5. The cooling apparatus for electronic-device exhaustion according to claim 1, wherein the vapor pipe is free of bent portions.

6. The cooling apparatus for electronic-device exhaustion according to claim 1, wherein the fluid pipe is connected to the condenser unit without having a portion upwardly extending from the condenser unit to the plurality of evaporator units.

* * * * *